US011277932B2

United States Patent
Seike et al.

(10) Patent No.: US 11,277,932 B2
(45) Date of Patent: Mar. 15, 2022

(54) POWER CONVERSION DEVICE

(71) Applicant: Mitsubishi Electric Corporation, Tokyo (JP)

(72) Inventors: Kohei Seike, Tokyo (JP); Ryohei Hayashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 110 days.

(21) Appl. No.: 16/603,891

(22) PCT Filed: Apr. 21, 2017

(86) PCT No.: PCT/JP2017/016072
§ 371 (c)(1),
(2) Date: Oct. 9, 2019

(87) PCT Pub. No.: WO2018/193625
PCT Pub. Date: Oct. 25, 2018

(65) Prior Publication Data
US 2020/0120826 A1 Apr. 16, 2020

(51) Int. Cl.
H01L 23/40 (2006.01)
H05K 7/14 (2006.01)
H05K 7/20 (2006.01)

(52) U.S. Cl.
CPC ....... H05K 7/1432 (2013.01); H01L 23/4006 (2013.01); H05K 7/2049 (2013.01)

(58) Field of Classification Search
CPC .......................... H01L 23/40; H01L 23/4006
See application file for complete search history.

(56) References Cited

U.S. PATENT DOCUMENTS 7,880,299 B2 * 2/2011 Kimura ............... H05K 7/2049
257/718
9,590,622 B1 * 3/2017 Inaba .................. H01L 23/3675
2005/0230820 A1 * 10/2005 Licht ...................... H01L 24/82
257/720
2009/0039504 A1 2/2009 Kimura et al.
(Continued)

FOREIGN PATENT DOCUMENTS

DE 102009053998 A1 5/2011
JP 2004-134491 A 4/2004
(Continued)

OTHER PUBLICATIONS

International Search Report for PCT/JP2017/016072, dated Jun. 27, 2017.
(Continued)

Primary Examiner — Jae Lee
(74) Attorney, Agent, or Firm — Sughrue Mion, PLLC; Richard C. Turner

(57) ABSTRACT

Provided is a power conversion device, including: a semiconductor module including a semiconductor switching element; a heat sink configured to cool the semiconductor module; a spring member configured to press the semiconductor module onto the heat sink; a casing configured to accommodate the semiconductor module and the spring member; and a bridge-like structure configured to press the semiconductor module onto the heat sink through intermediation of the spring member when the casing is mounted to the heat sink.

15 Claims, 11 Drawing Sheets

(56) References Cited

U.S. PATENT DOCUMENTS

2013/0021753 A1    1/2013   Enami et al.
2016/0229618 A1*   8/2016   Savic ................ B65D 43/0202

FOREIGN PATENT DOCUMENTS

| JP | 4129027 B2 | 7/2008 |
|---|---|---|
| JP | 2009-43863 A | 2/2009 |
| JP | 2013-026320 A | 2/2013 |

OTHER PUBLICATIONS

Communication dated Nov. 24, 2021 from the German Patent and Trademark Office in DE Application No. 11 2017 007 459.2.

\* cited by examiner

POWER CONVERSION DEVICE

CROSS REFERENCE TO RELATED APPLICATIONS

This application is a National Stage of International Application No. PCT/JP2017/016072 filed Apr. 21, 2017.

TECHNICAL FIELD

The present invention relates to a power conversion device having a heat dissipation structure.

BACKGROUND ART

In a related-art power conversion device, a semiconductor module including a semiconductor element is used. The semiconductor module generates heat at the time of switching, and hence it is desired that the semiconductor module be cooled. As a method of cooling the semiconductor module, for example, there is given a method of cooling the semiconductor module through a heat sink to which the semiconductor module is mounted.

In the related-art power conversion device, the semiconductor module is pressed onto the heat sink by a spring member. With this configuration, a degree of close contact between the semiconductor module and the heat sink is improved, and hence a heat transfer coefficient can be improved. That is, heat is easily dissipated from the semiconductor module.

In the related art, the spring member is arranged on the semiconductor module arranged on an upper surface of the heat sink, and a reinforcement beam configured to reinforce the spring member is arranged on the spring member. Through-holes are formed in the reinforcement beam. Further, under a state in which the reinforcement beam and the spring member are stacked, the reinforcement beam is fastened with screws to the heat sink side so that the semiconductor module is brought into close contact with the heat sink (for example, see Patent Literature 1).

CITATION LIST

Patent Literature

[PTL 1] JP 4129027 B2

SUMMARY OF INVENTION

Technical Problem

However, the related art has the following problems.

In the related art, in order to press the semiconductor module onto the heat sink, the spring member and the reinforcement beam are required. Accordingly, the number of components in the related-art power conversion device is increased. Moreover, due to the increase in number of components, the related-art power conversion device has a problem such as limitation on the internal structure of the casing or increase in number of assembling steps.

The present invention has been made to solve the problems described above, and has an object to obtain a power conversion device having a structure capable of reducing the number of components inside a casing and the number of assembling steps as compared to those in the related art.

Solution to Problem

According to one embodiment of the present invention, there is provided a power conversion device, including: a semiconductor module including a semiconductor switching element; a heat sink configured to cool the semiconductor module; a spring member configured to press the semiconductor module onto the heat sink; a casing configured to accommodate the semiconductor module and the spring member; and a bridge-like structure configured to press the semiconductor module onto the heat sink through intermediation of the spring member when the casing is mounted to the heat sink.

Advantageous Effects of Invention

According to the present invention, for the purpose of cooling the heat generating components, such as the semiconductor module and an energizing component, instead of mounting and fixing the reinforcement beam on top of the spring member, there is provided a structure which is capable of pressing the spring member by mounting and fixing the casing, and the semiconductor module can be fixed to the heat sink by mounting the casing. As a result, it is possible to obtain the power conversion device having the structure capable of reducing the number of components inside the casing and the number of assembly steps as compared to those in the related art.

DESCRIPTION OF EMBODIMENTS

A power conversion device according to exemplary embodiments of the present invention is described below with reference to the accompanying drawings. The following embodiments are not to limit the present invention.

First Embodiment

Figure 1:
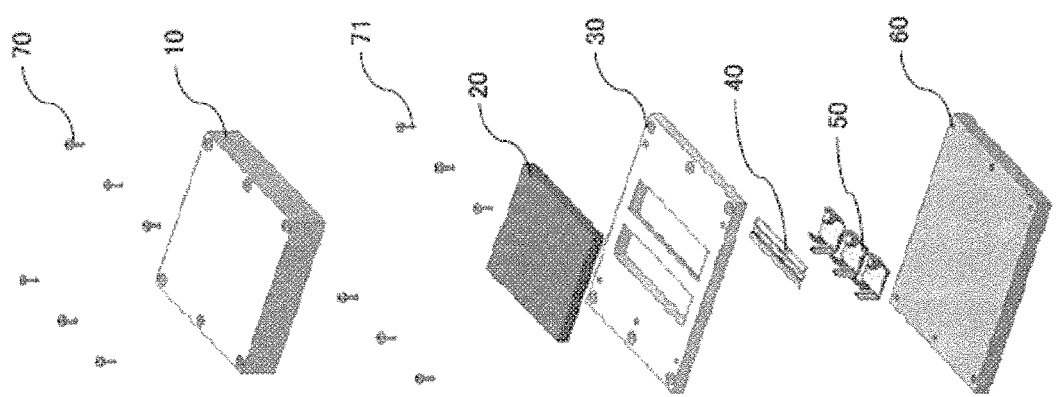
FIG. 1 is a perspective exploded view for illustrating a power conversion device according to a first embodiment of the present invention.

FIG. 1 is a perspective exploded view for illustrating a power conversion device according to a first embodiment of the present invention. Further, FIG. 2 is a sectional view for illustrating the power conversion device according to the first embodiment of the present invention having a configuration of FIG. 1.

The power conversion device according to the first embodiment illustrated in FIG. 1 has a structure in which a cover 10, a circuit unit 20, a casing 30, a plate spring 40, a semiconductor module 50, and a heat sink 60 are stacked and fixed with screws 70 and 71.

Figure 2:
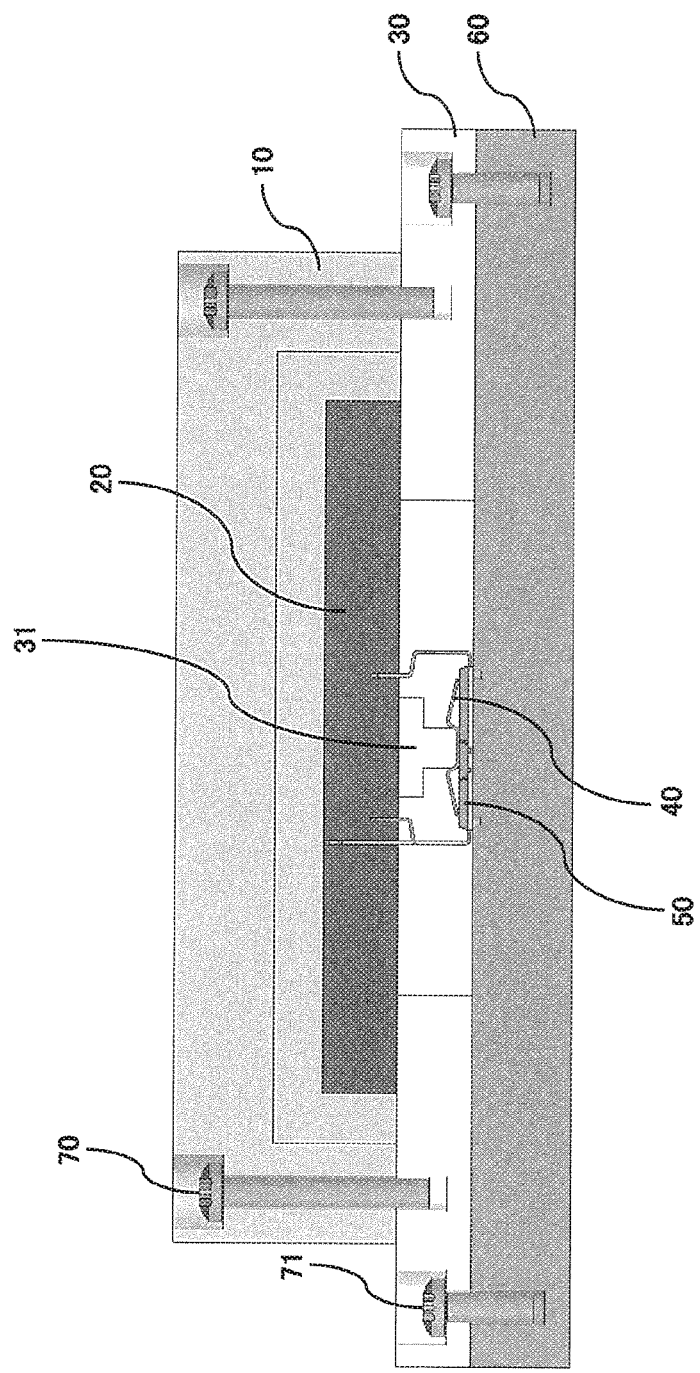
FIG. 2 is a sectional view for illustrating the power conversion device according to the first embodiment of the present invention having a configuration of FIG. 1.

As illustrated in FIG. 2, the casing 30 includes a bridge-like structure 31 that is used in place of a reinforcement beam. The casing 30 is assembled to the heat sink 50 with the screws 71, and thus the plate spring 40 is pressed by the bridge-like structure 31 at the same time. With this structure, the semiconductor module 50 is brought into close contact with the heat sink 50.

Moreover, the cover 10 is assembled to the casing 30 with the screws 70 so that the circuit unit 20 is sandwiched between the cover 10 and the casing 30.

As described above, according to the first embodiment, the semiconductor module 50 can be joined to the heat sink 50 through use of the casing 30 including the bridge-like structure 31. Accordingly, the reinforcement beam required for the related-art power conversion device is not required. As a result, it is possible to achieve the power conversion device having a structure capable of reducing the number of components inside the casing and the number of assembling steps as compared to those in the related art.

Second Embodiment

Figure 3:
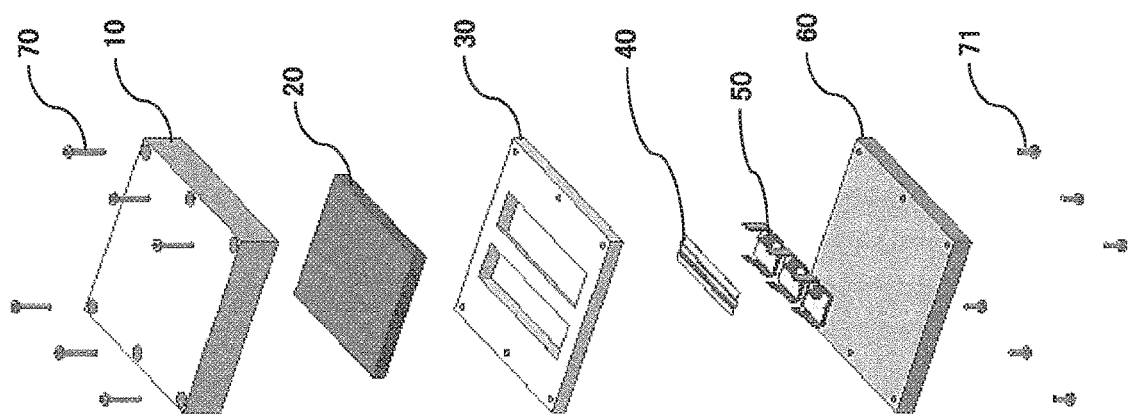
FIG. 3 is a perspective exploded view for illustrating a power conversion device according to a second embodiment of the present invention.
Figure 4:
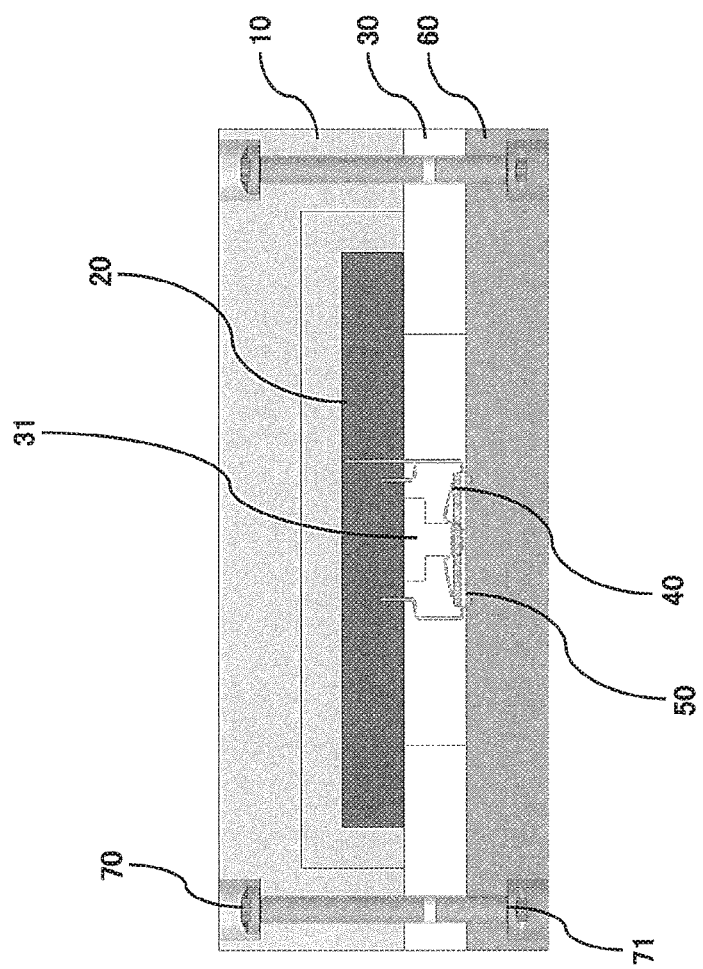
FIG. 4 is a sectional view for illustrating the power conversion device according to the second embodiment of the present invention having a configuration of FIG. 3.

FIG. 3 is a perspective exploded view for illustrating a power conversion device according to a second embodiment of the present invention. Further, FIG. 4 is a sectional view for illustrating the power conversion device according to the second embodiment of the present invention having a configuration of FIG. 3.

The power conversion device according to the second embodiment illustrated in FIG. 3, similarly to the above-mentioned first embodiment, has a structure in which a cover 10, a circuit unit 20, a casing 30, a plate spring 40, a semiconductor module 50, and a heat sink 60 are stacked and fixed with screws 70 and 71. The second embodiment is different from the above-mentioned first embodiment in a fixing method with the screws 71. Therefore, this difference is mainly described below.

In the above-mentioned first embodiment, the following structure is adopted. Specifically, after the casing 30 is fastened to the heat sink 60 with the screws 71, the circuit unit 20 is placed on top of the casing 30. Then, the cover 10 is mounted to the casing 30 through use of other screw holes.

Meanwhile, in the second embodiment, when the casing 30 is fastened to the heat sink 60 with screws, the casing 30 is fastened with the screws 71 from the heat sink 60 side. As a result, screw holes for the screws 70 for mounting the cover 10 to the casing 30, and screw holes for the screws 71 can be used in common, thereby being capable of reducing the number of screw-fastening points.

As described above, according to the second embodiment, the same effects as those of the above-mentioned first embodiment can be achieved. Moreover, according to the second embodiment, the fixing method with the screws is devised to share the screw holes. Thus, the number of screw-fastening points can also be reduced.

Third Embodiment

Figure 5:
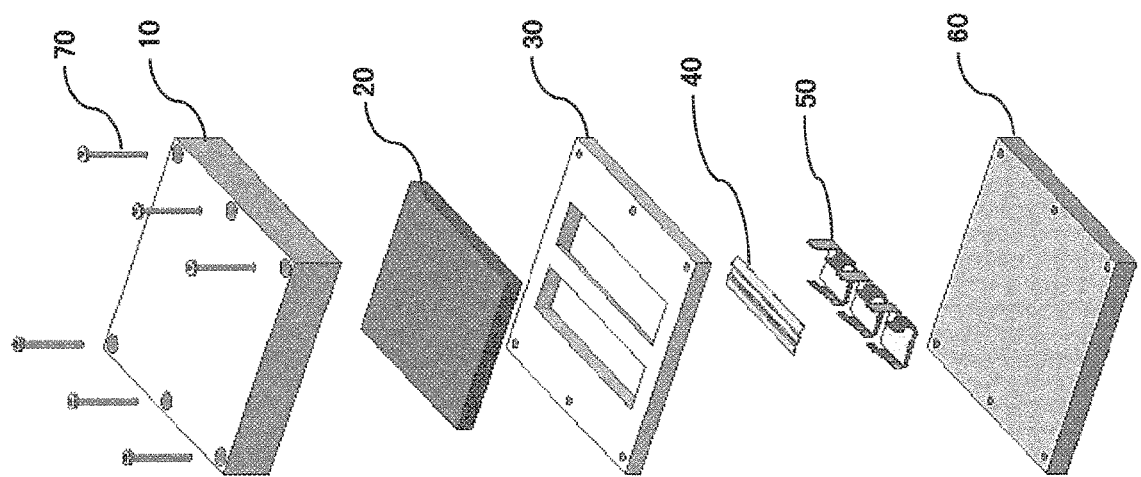
FIG. 5 is a perspective exploded view for illustrating a power conversion device according to a third embodiment of the present invention.
Figure 6:
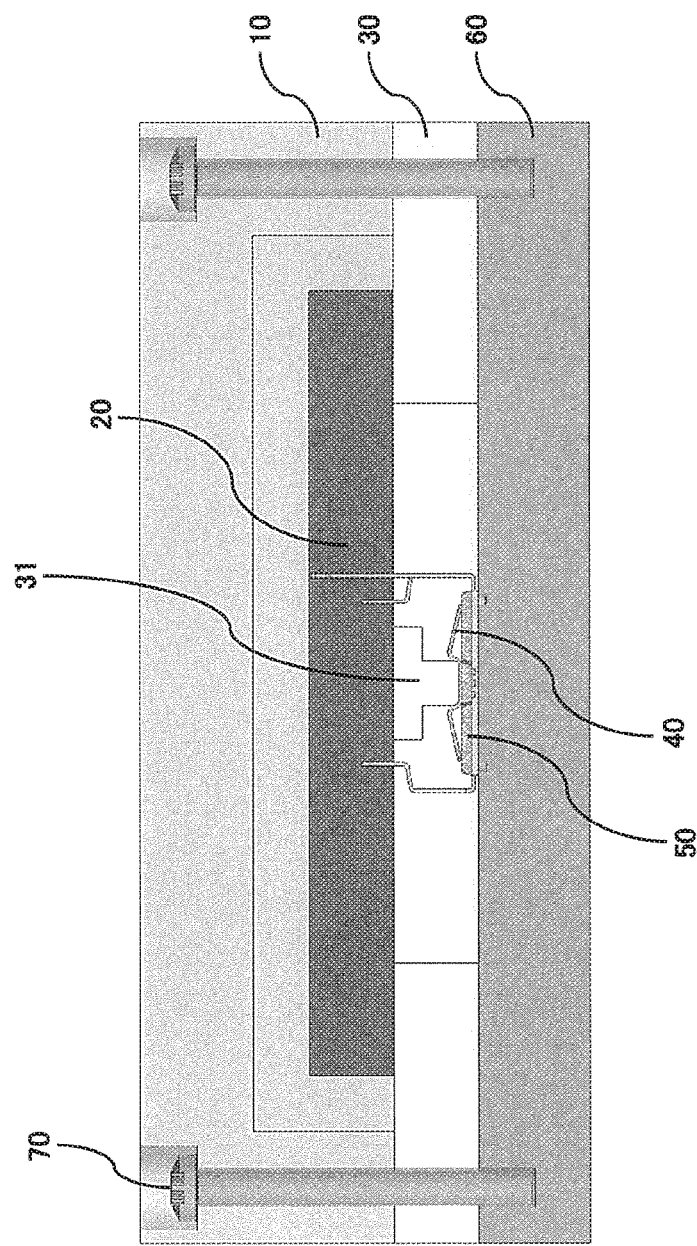
FIG. 6 is a sectional view for illustrating the power conversion device according to the third embodiment of the present invention having a configuration of FIG. 5.

FIG. 5 is a perspective exploded view for illustrating a power conversion device according to a third embodiment of the present invention. Further, FIG. 6 is a sectional view for illustrating the power conversion device according to the third embodiment of the present invention having a configuration of FIG. 5.

The power conversion device according to the third embodiment illustrated in FIG. 5 has the structure in which a cover 10, a circuit unit 20, a casing 30, a plate spring 40, a semiconductor module 50, and a heat sink 60 are stacked and fixed only with screws 70. The third embodiment is different from the above-mentioned first and second embodiments in a fixing method without the screws 71. Therefore, this difference is mainly described below.

In the third embodiment, the following structure is adopted. Specifically, the casing 30 is placed on the heat sink 60, and the circuit unit 20 is placed on top of the casing 30. Then, the cover 10 is placed on the casing 30, and three components, namely, the heat sink 60, the casing 30, and the cover 10 are fastened with the screws 70 of one kind. In this manner, the screws can be used in common, thereby reducing the number of screws and the number of screw-fastening points.

As described above, according to the third embodiment, the same effects as those of the above-mentioned first embodiment can be achieved. Moreover, according to the third embodiment, the fixing method with the screws is devised to share the screw holes, and one kind of the screws is used. Thus, the number of screws, and the number of screw-fastening points can also be reduced.

Fourth Embodiment

Figure 7:
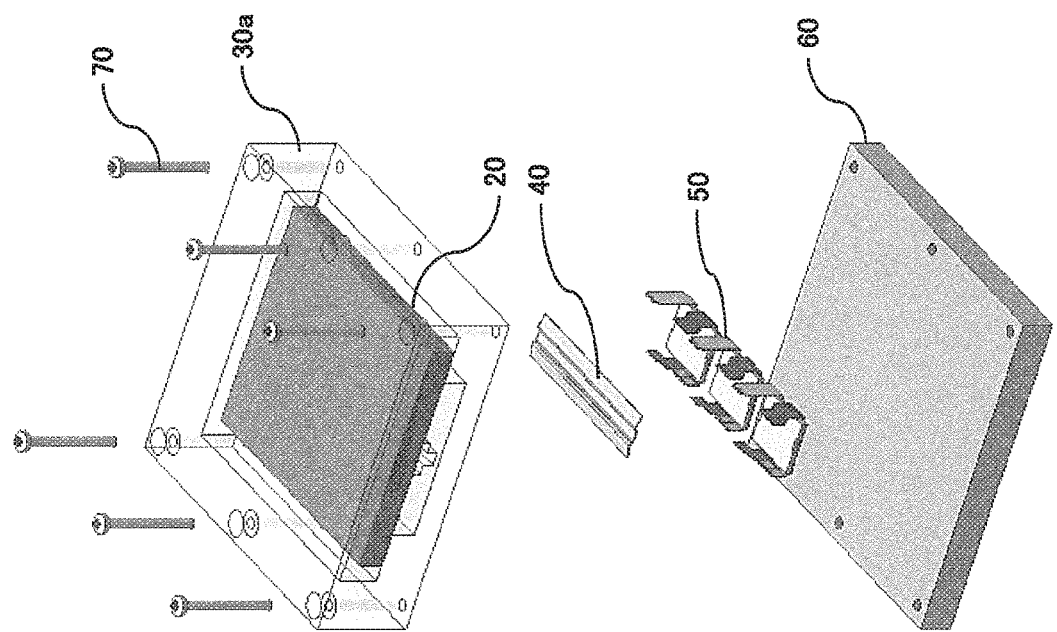
FIG. 7 is a perspective exploded view for illustrating a power conversion device according to a fourth embodiment of the present invention.
Figure 8:
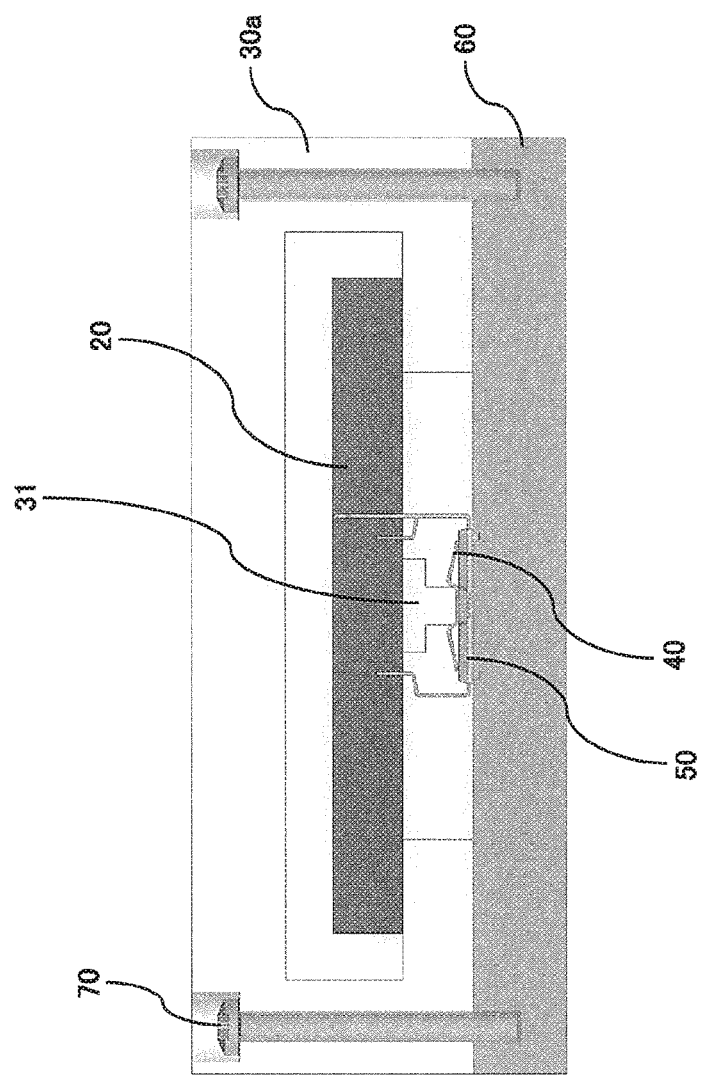
FIG. 8 is a sectional view for illustrating the power conversion device according to the fourth embodiment of the present invention having a configuration of FIG. 7.

FIG. 7 is a perspective exploded view for illustrating a power conversion device according to a fourth embodiment of the present invention. Further, FIG. 8 is a sectional view for illustrating the power conversion device according to the fourth embodiment of the present invention having a configuration of FIG. 7.

The power conversion device according to the fourth embodiment illustrated in FIG. 7 has the structure in which a casing 30a, a circuit unit 20, a plate spring 40, a semiconductor module 50, and a heat sink 60 are stacked and fixed only with screws 70. That is, as compared to the above-mentioned third embodiment, in the fourth embodiment, the casing 30a has a function of the cover 10, to thereby integrate the cover 10 and the casing 30 with each other. Therefore, this difference is mainly described below.

In the fourth embodiment, the semiconductor module 50 and the circuit unit 20 are placed on the heat sink 60, and then the casing 30a having functions of the reinforcement beam and the cover is placed. With this structure, further reduction in the number of components is achieved.

As described above, according to the fourth embodiment, the same effects as those of the above-mentioned first embodiment can be achieved. Moreover, according to the fourth embodiment, the cover and the casing are integrated with each other, thereby being capable of achieving further reduction in the number of components.

Fifth Embodiment

Figure 9:
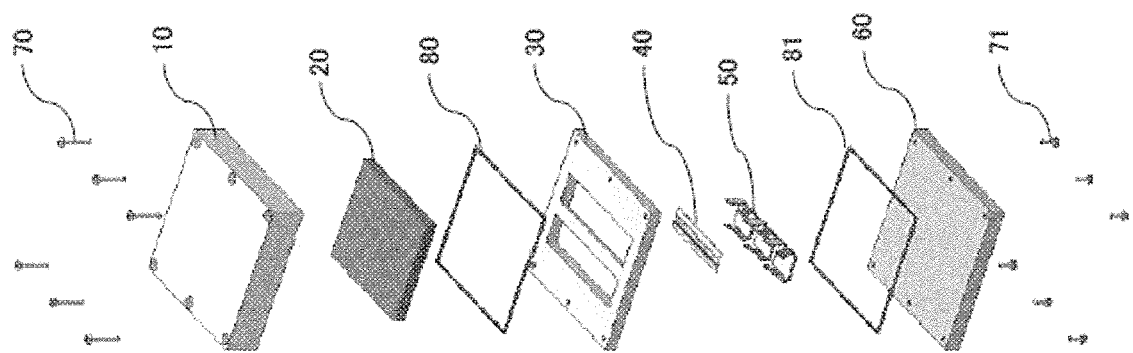
FIG. 9 is a perspective exploded view for illustrating a power conversion device according to a fifth embodiment of the present invention.
Figure 10:
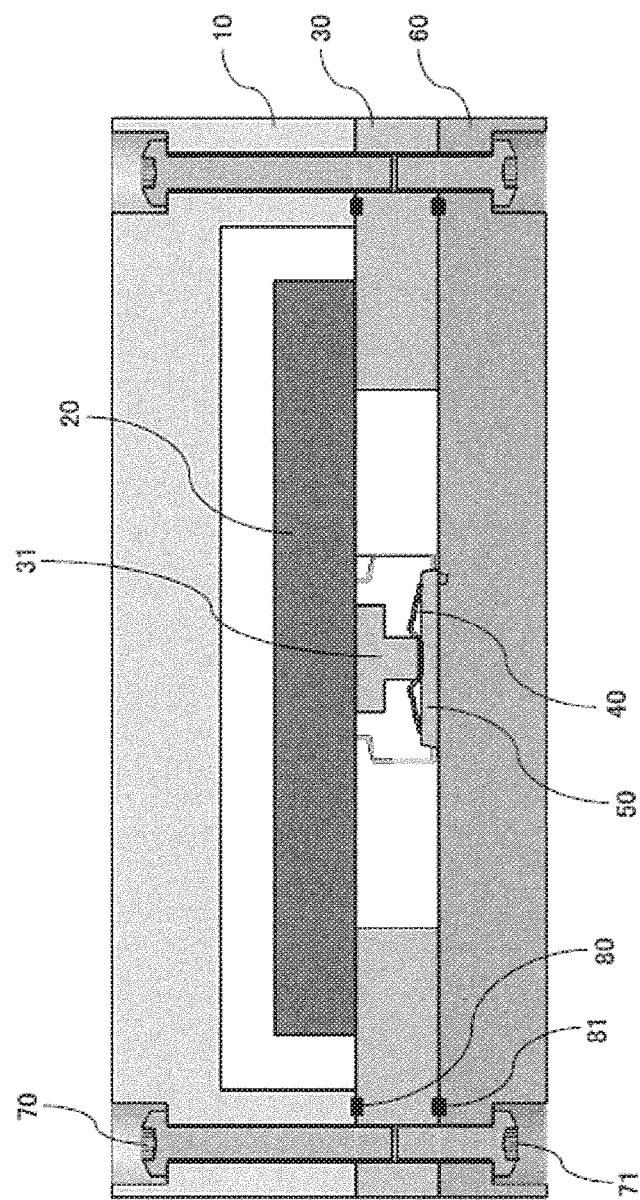
FIG. 10 is a sectional view for illustrating the power conversion device according to the fifth embodiment of the present invention having a configuration of FIG. 9.

FIG. 9 is a perspective exploded view for illustrating a power conversion device according to a fifth embodiment of the present invention. Further, FIG. 10 is a sectional view for illustrating the power conversion device according to the fifth embodiment of the present invention having a configuration of FIG. 9.

The power conversion device according to the fifth embodiment illustrated in FIG. 9 has the structure in which a cover 10, a circuit unit 20, a packing 80, a casing 30, a plate spring 40, a semiconductor module 50, a packing 81, and a heat sink 60 are stacked and fixed with screws 70 and 71. The fifth embodiment is different from the above-mentioned second embodiment in that the packings 80 and 81 are further provided. Therefore, this difference is mainly described below.

In the power conversion device according to the fifth embodiment, the packing 80 is provided between the cover 10 and the casing 30, and the packing 81 is provided between the casing 30 and the heat sink 60. Through adoption of this structure, the packings 80 and 81 can provide waterproofness and dustproofness between the casing 30 and the heat sink 60, thereby being capable of protecting the circuit unit 20 from entry of water and foreign matters from an outside.

As described above, according to the fifth embodiment, the same effects as those of the above-mentioned second embodiment can be achieved. Moreover, according to the fifth embodiment, through incorporation of the packings, the power conversion device further having waterproofness and dustproofness can be achieved.

Sixth Embodiment

Figure 11:
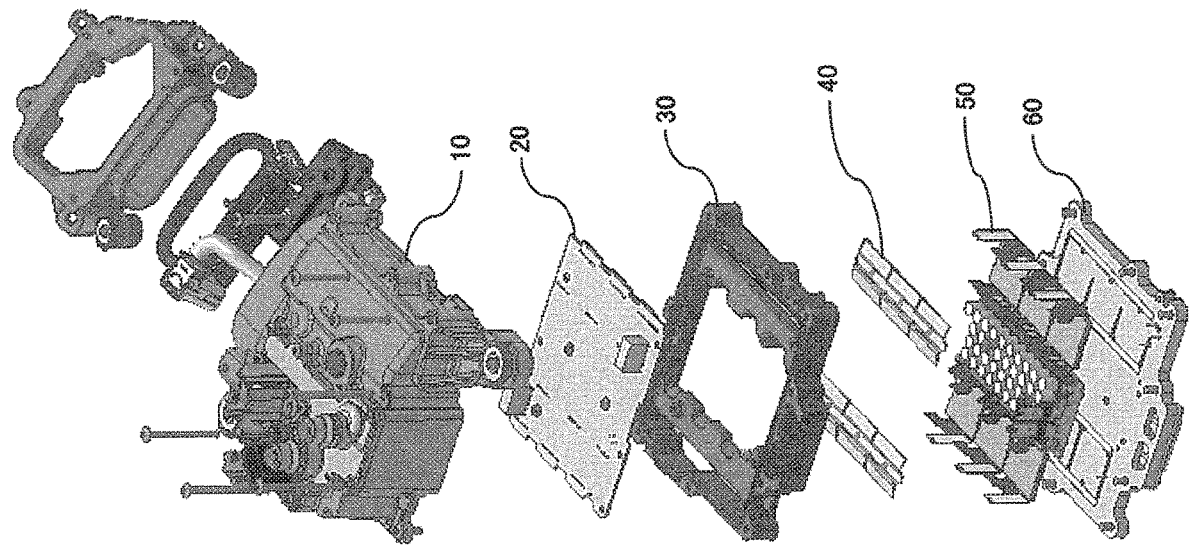
FIG. 11 is a perspective exploded view for illustrating a power conversion device according to a sixth embodiment of the present invention.

FIG. 11 is a perspective exploded view for illustrating a power conversion device according to a sixth embodiment of the present invention. In the sixth embodiment, the casing 30 includes a plurality of bridge-like structures 31. Through adoption of this structure, the number of semiconductor modules 50 to be arranged can be increased.

As described above, according to the sixth embodiment, the same effects as those of the above-mentioned first embodiment can be achieved. Moreover, according to the sixth embodiment, through use of the casing including the plurality of bridge-like structures each functioning as the reinforcement beam, the number of semiconductor modules to be arranged can be increased, and a degree of freedom in design for the power conversion device can be improved.

In the power conversion devices according to the first embodiment to the sixth embodiment described above, the casing and the bridge-like structure are integrated with each other, but the present invention is not limited to this configuration. For example, there may be adopted a configuration in which the casing and the bridge-like structure are divided into a plurality of components, specifically, a configuration in which the bridge-like structure functioning as the reinforcement beam is fixed by the casing when a spring member is pressed. Through provision of the casing and the bridge-like structure as separate members in this manner, the structure of the casing can be simplified.

Further, in the first embodiment to the sixth embodiment described above, a material for the casing is not particularly specified. However, it is desired that the casing be made of a material having a low melting point, such as aluminum alloy or zinc alloy that is processable by die casting and has high thermal conductivity. Further, as long as the casing is made of a material having a high thermal conductivity, the material for the casing is not limited to metal. A resin material processable by molding may be used.

REFERENCE SIGNS LIST 10 cover, 20 circuit unit, 30, 30a casing, 31 bridge-like structure, 40 plate spring, 50 semiconductor module, 60 heat sink, 70, 71 screw, 80, 81 packing

The invention claimed is:

1. A power conversion device, comprising:
   a semiconductor module including a semiconductor switching element;
   a heat sink disposed on a first side of the semiconductor module and configured to cool the semiconductor module;
   a spring member disposed opposing the heat sink on a second side of the semiconductor module and configured to press the semiconductor module onto the heat sink;
   a casing configured to accommodate the semiconductor module and the spring member; and
   a bridge-like structure comprising a rib facing the spring member and the semiconductor module, the rib being configured to press the semiconductor module onto the heat sink, through intermediation of the spring member sandwiched between the rib and the semiconductor module, by a pressure applied by the casing to the bridge-like structure when the casing is mounted to the heat sink.

2. The power conversion device according to claim 1, wherein, when the casing is mounted to the heat sink, the casing is arranged on a semiconductor module mounting surface of the heat sink, and is fixed through screw fastening from a surface opposite to the semiconductor module mounting surface of the heat sink.

3. The power conversion device according to claim 2, further comprising a cover configured to cover the casing, wherein a screw hole for fastening the cover to the casing with a screw and a screw hole for fastening the heat sink to the casing with a screw are used in common.

4. The power conversion device according to claim 1, further comprising a cover configured to cover the casing, wherein the casing and the cover are fastened to the heat sink together.

5. The power conversion device according to claim 1, wherein the casing includes a cover configured to cover the semiconductor module and the spring member accommodated in the casing.

6. The power conversion device according to claim 3, further comprising:
   a packing arranged between the heat sink and the casing; and
   a packing arranged between the casing and the cover.

7. The power conversion device according to claim 1, wherein the semiconductor module is one of a plurality of semiconductor modules, and
   the bridge-like structure comprises a plurality of bridge-like structures provided in accordance with a number of the plurality of semiconductor modules to be pressed onto the heat sink.

8. The power conversion device according to claim 1, wherein the bridge-like structure is integrated with the casing.

9. The power conversion device according to claim 1, wherein the bridge-like structure is provided separately from the casing.

10. The power conversion device according to claim 1, wherein the casing is made of aluminum alloy or zinc alloy.

11. The power conversion device according to claim 1, wherein the casing is made of a resin material.

12. The power conversion device according to claim 1, wherein the rib is formed in the casing so as to face the spring member and the semiconductor module.

13. A power conversion device comprising:
a semiconductor module including a semiconductor switching element;
a heat sink configured to cool the semiconductor module;
a spring member configured to press the semiconductor module onto the heat sink;
a casing configured to accommodate the semiconductor module and the spring member; and
a bridge-like structure configured to press the semiconductor module onto the heat sink through intermediation of the spring member when the casing is mounted to the heat sink,
wherein, when the casing is mounted to the heat sink, the casing is arranged on a semiconductor module mounting surface of the heat sink, and is fixed through screw fastening from a surface opposite to the semiconductor module mounting surface of the heat sink,
wherein the power conversion device further comprises a cover configured to cover the casing, and
wherein a screw hole for fastening the cover to the casing with a screw and a screw hole for fastening the heat sink to the casing with a screw are used in common.

14. The power conversion device according to claim 13, further comprising:
a packing arranged between the heat sink and the casing; and a packing arranged between the casing and the cover.

15. A power conversion device comprising:
a semiconductor module including a semiconductor switching element;
a heat sink configured to cool the semiconductor module;
a spring member configured to press the semiconductor module onto the heat sink;
a casing configured to accommodate the semiconductor module and the spring member; and
a bridge-like structure configured to press the semiconductor module onto the heat sink through intermediation of the spring member when the casing is mounted to the heat sink,
wherein the semiconductor module is one of a plurality of semiconductor modules, and
the bridge-like structure comprises a plurality of bridge-like structures provided in accordance with a number of the plurality of semiconductor modules to be pressed onto the heat sink.

* * * * *